(12) United States Patent
Yoneda

(10) Patent No.: US 12,541,075 B2
(45) Date of Patent: Feb. 3, 2026

(54) OPTICAL SENSOR MODULE

(71) Applicant: Mitsubishi Electric Corporation, Tokyo (JP)

(72) Inventor: Yutaka Yoneda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 624 days.

(21) Appl. No.: 17/615,166

(22) PCT Filed: Aug. 8, 2019

(86) PCT No.: PCT/JP2019/031373
§ 371 (c)(1),
(2) Date: Nov. 30, 2021

(87) PCT Pub. No.: WO2021/024453
PCT Pub. Date: Feb. 11, 2021

(65) Prior Publication Data
US 2022/0236512 A1    Jul. 28, 2022

(51) Int. Cl.
*G02B 7/02*  (2021.01)
*H10F 30/10* (2025.01)
(Continued)

(52) U.S. Cl.
CPC ........... *G02B 7/025* (2013.01); *H10F 77/407* (2025.01); *H10F 77/50* (2025.01); *H10F 30/10* (2025.01); *H10F 30/221* (2025.01)

(58) Field of Classification Search
CPC .............. G02B 7/025; H01L 23/02–10; H01L 23/16–26; H01L 25/165;
(Continued)

(56) References Cited

U.S. PATENT DOCUMENTS 5,932,875 A * 8/1999 Chung .................... H10F 77/50
257/E31.118
6,762,796 B1 7/2004 Nakajoh et al.
(Continued)

FOREIGN PATENT DOCUMENTS

JP    H0590429 A  *  4/1993  ... H01L 2224/48091
JP    2000-125212 A    4/2000
(Continued)

OTHER PUBLICATIONS

International Search Report issued in PCT/JP2019/031373; mailed Nov. 5, 2019.
(Continued)

*Primary Examiner* — Britt D Hanley
*Assistant Examiner* — Casey Paul Boatman
(74) *Attorney, Agent, or Firm* — Studebaker Brackett PLLC

(57) ABSTRACT

This optical sensor module includes: a substrate having an electrode pattern formed on a surface thereof; a photodetector for detecting light, the photodetector being electrically connected to the electrode pattern and being fixed to the substrate; and a lens holding member to which a lens is fixed, the lens holding member being adhered to the substrate by an adhesive agent at such a position as to surround the photodetector, wherein a bottom surface of the lens holding member adhered to the substrate has projections located in a distributed manner, and distal ends of the projections are in contact with the substrate.

14 Claims, 7 Drawing Sheets

(51) Int. Cl.
*H10F 30/221* (2025.01)
*H10F 77/40* (2025.01)
*H10F 77/50* (2025.01)

(58) Field of Classification Search
CPC ........... H01L 21/52–54; H01L 21/4817; H01L 21/4803–481; H01L 2924/15–17798; H10F 77/407; H10F 77/50
See application file for complete search history.

(56) References Cited

U.S. PATENT DOCUMENTS

| | | | | |
|---|---|---|---|---|
| 2002/0121706 | A1* | 9/2002 | Tatsuta | H01L 23/13 |
| | | | | 257/E23.068 |
| 2006/0243896 | A1* | 11/2006 | Chen | H01L 31/0203 |
| | | | | 257/434 |
| 2007/0126010 | A1* | 6/2007 | Chua | H01L 31/02327 |
| | | | | 257/E31.127 |
| 2010/0065929 | A1* | 3/2010 | Okada | H01L 23/3135 |
| | | | | 257/E31.127 |
| 2016/0336716 | A1* | 11/2016 | Adachi | H01L 33/486 |
| 2019/0339478 | A1* | 11/2019 | Hirooka | H04N 25/70 |

FOREIGN PATENT DOCUMENTS

| | | | |
|---|---|---|---|
| JP | 2006-086672 A | | 3/2006 |
| JP | 2007-142425 A | | 6/2007 |
| JP | 2011-174762 A | | 9/2011 |
| KR | 10-2010-0099874 A | | 9/2010 |
| KR | 20130119661 A | * | 11/2013 ............. H04N 23/57 |

OTHER PUBLICATIONS

An Office Action mailed by China National Intellectual Property Administration on Jul. 6, 2024, which corresponds to Chinese Patent Application No. 201980098646.9 and is related to U.S. Appl. No. 17/615,166; with English language translation.

* cited by examiner

OPTICAL SENSOR MODULE

TECHNICAL FIELD

The present disclosure relates to an optical sensor module.

BACKGROUND ART

Conventionally, an optical sensor module has been known which includes an infrared detector, a lens holding member storing the infrared detector, and a lens fixed to the lens holding member so as to be located forward of the infrared detector with the focal point of the lens overlapping a light receiving portion of the infrared detector.

In the optical sensor module, for example, the lens holding member fixing and holding the lens is positioned relative to the infrared detector joined onto an insulating substrate such that the focal point of the lens overlaps the light receiving portion of the infrared detector. For this purpose, an adhesive agent (ultraviolet (UV) curable adhesive agent) is pasted in advance at a position where the bottom surface of the positioned lens holding member comes into contact with the insulating substrate, and then the lens holding member is mounted at the positioned location. Thereafter, ultraviolet rays are applied to the adhesive agent pasted part, to cure the adhesive agent, so that the relative positions of the infrared detector and the lens fixed to the lens holding member will not change.

When the adhesive agent is cured, the lens holding member to which the lens is fixed and the insulating substrate to which the infrared detector is joined are adhered to each other, and thus the relative positions of the light receiving portion of the infrared detector and the focal point of the lens are no longer changed. However, in the conventional optical sensor module, the adhesive agent thickness between the lens holding member and the substrate after the lens holding member is mounted thereon cannot be controlled. Therefore, in a case of performing adhesion using an apparatus not having an active alignment function that enables the lens holding member to be mounted while viewing an image acquired by operating the infrared detector, the lens holding member might be mounted in an inclined state with respect to the substrate, due to thickness variation of the adhesive agent, smallness of a load for mounting the lens holding member, imbalance of the position where the lens holding member is adhered, and the like. As a result, there is a possibility that the focal point of the lens deviates from the light receiving portion of the infrared detector and thus the optical sensor module becomes unable to receive light correctly.

The optical sensor module is assembled such that the position of the lens is set with the focal point thereof overlapping the light receiving portion of the infrared detector, in order to enable correct imaging by the infrared detector. However, in particular, in a case where the lens is formed integrally with the lens holding member, if the lens holding member is inclined with respect to the infrared detector, there is a possibility that the focal point of the lens deviates from the light receiving portion of the infrared detector and thus light reception cannot be performed correctly. In addition, when the lens holding member is mounted, a wiring member and the like for operating the infrared detector are present on the substrate positioned inside the lens holding member. Therefore, when the lens holding member is mounted on the adhesive agent, if the amount of the pasted adhesive agent is large or the load for mounting the lens holding member is great, the adhesive agent compressed by the lens holding member and thus wetting and spreading to the inner side of the lens holding member comes into contact with the wiring member on the inner side of the lens holding member. The wiring member in contact with the adhesive agent is deformed to come into contact with the wiring member therearound or lead to breakage of a wire, thus causing such a risk that the infrared detector becomes unable to operate, for example.

In addition, in a general optical sensor module, the lens holding member and the lens are separate members. Therefore, after the lens holding member is adhered onto the substrate, before the lens is attached to the lens holding member, it is possible to inspect whether or not the adhesive agent protruding to the inner side of the lens holding member is in contact with the wiring member or whether or not the lens holding member is inclined. Accordingly, if there is any problem, the position of the wiring member can be corrected, the lens can be attached so as to cancel out the inclination of the lens holding member, or at worst, this unit can be discarded on the spot. However, in an optical sensor module having the lens and the lens holding member integrated with each other so as to reduce the size as compared to the general optical sensor module, the cost required for members can be reduced but it is impossible to correct the inclination of the lens after the lens holding member is adhered onto the substrate. Moreover, operation failure due to contact between the adhesive agent and the wiring member cannot be inspected until the sensor is actually operated. Therefore, the loss cost when failure occurs is greater than in the case of the general optical sensor module.

In order to solve such problems, as an optical sensor module that can prevent the adhesive agent from entering the inner side of the lens holding member and can also suppress inclination of the lens holding member, a structure is proposed in which the lens holding member and the substrate are in contact with each other, a filling space for the adhesive agent is formed on the outer peripheral side of the lens holding member at the contact part, and the lens holding member is adhered to the substrate (see Patent Document 1).

CITATION LIST

PATENT DOCUMENT

Patent Document 1: JP2006-86672A

SUMMARY OF THE INVENTION

Problems to be Solved by the Invention

In the optical sensor module described in Patent Document 1, since the lens holding member and the substrate are in contact with each other at the contact surface of the lens holding member, inclination of the lens holding member is suppressed, and the adhesive agent is less likely to enter the inner side of the lens holding member. However, in order to bring the lens holding member and the substrate into contact with each other without gaps, working of the contact surface of the lens holding member is required to be accurate, and it is necessary to fill the filling space formed at the outer periphery of the lens holding member with a predetermined amount of adhesive agent while keeping the lens holding member and the substrate in contact with each other. Thus, the process for filling with the adhesive agent is complicated.

The present disclosure has been made to solve the above problems, and an object of the present disclosure is to provide an optical sensor module that enables an adhesive agent to be easily pasted and suppresses inclination of the lens holding member.

Solution to the Problems

An optical sensor module according to the present disclosure includes: a substrate having an electrode pattern formed on a surface thereof; a photodetector for detecting light, the photodetector being electrically connected to the electrode pattern and being fixed to the substrate; and a lens holding member to which a lens is fixed, the lens holding member being adhered to the substrate by an adhesive agent at such a position as to surround the photodetector, wherein a bottom surface of the lens holding member adhered to the substrate has projections located in a distributed manner, and distal ends of the projections are in contact with the substrate.

Effect of the Invention

The optical sensor module according to the present disclosure makes it possible to provide an optical sensor module that enables an adhesive agent to be easily pasted and suppresses inclination of the lens holding member.

DESCRIPTION OF EMBODIMENTS

Figure 1:
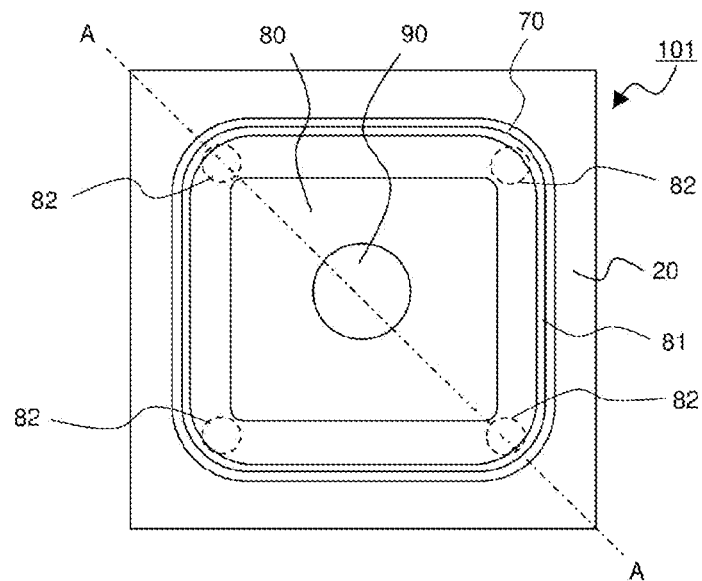
FIG. 1 is a plan view showing the structure of an optical sensor module according to embodiment 1.

Embodiments of an optical sensor module according to the present disclosure will be described with reference to the drawings. In the drawings, the same or similar constituent parts are denoted by the same reference characters. For the purpose of avoiding unnecessary redundant description and facilitating the understanding for a person skilled in the art, description of well-known matters and repetitive description of substantially the same configuration may be omitted.

In the drawings, the sizes or the scales of the corresponding constituent parts are independent of each other. For example, between a drawing in which the structure is partially changed and a drawing without such a change, the size or the scale of the same constituent part may be different. In the structure of the optical sensor module, although more other members are actually provided, only parts necessary for explanation of the present disclosure are described and description of the other parts is omitted. In the following description, as an example of the optical sensor module, an optical sensor module for detecting infrared rays is described. However, the embodiments are applicable to various types of optical sensor modules such as a visible-light optical sensor module having the same problems, as well as the infrared optical sensor module.

Embodiment 1

Figure 2:
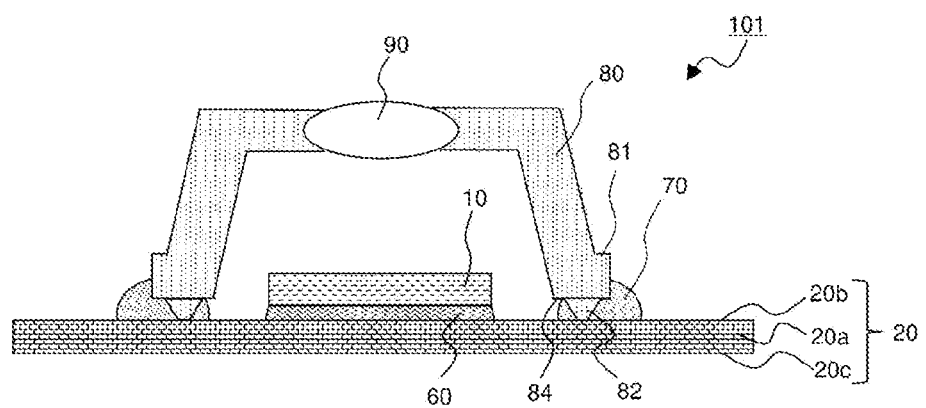
FIG. 2 is a sectional view along line A-A in FIG. 1, showing the structure of the optical sensor module according to embodiment 1.

FIG. 1 is a plan view showing the schematic structure of an optical sensor module 101 according to embodiment 1, and FIG. 2 is a sectional view along line A-A in FIG. 1. The optical sensor module 101 includes, as basic components, an infrared detector 10 as a photodetector, a glass epoxy substrate 20 as a substrate, and a lens holding member 80 integrated with a lens 90 by inserting the lens 90 after molding and then caulking the periphery of the lens 90 with resin. The infrared detector 10 is adhered to one surface of the glass epoxy substrate 20 by Ag paste 60, and thus fixed and stored inside the lens holding member 80. The lens 90 for transmitting infrared rays therethrough and focusing the infrared rays is integrally fixed to the lens holding member 80, and a bottom surface 84 of the lens holding member 80 is adhered to the glass epoxy substrate 20 by an adhesive agent 70.

In FIG. 1 and FIG. 2, only basic constituent parts in the optical sensor module 101 are shown, and components that are not directly relevant to the present disclosure, such as a dedicated IC, wires, capacitors, and connectors, which are other components joined onto the glass epoxy substrate 20, are not shown.

The infrared detector 10 is a thermal-type infrared sensor, e.g., a resistance bolometer type sensor typically using vanadium oxide (VOx) or a silicon-on-insulator (SOI) diode bolometer type sensor using temperature characteristic of a P—N diode, and is made of Si.

The glass epoxy substrate 20 is a substrate including a circuit having various functions. The glass epoxy substrate 20 has a plate-shaped glass epoxy base 20a, and an electrode pattern 20b and an electrode pattern 20c formed on both surfaces of the glass epoxy base 20a. The electrode pattern 20b and the electrode pattern 20c electrically connect the infrared detector 10 fixed on the glass epoxy substrate 20 and another electronic device (not shown), and provide, for example, an interface for making connection to another circuit board, an external power supply, and the like. The glass epoxy base 20a is an electrically insulating material, and suffers stress caused by temperature increase during operation of the optical sensor module 101, due to linear expansion coefficient difference from the lens holding member 80 adhered to the glass epoxy substrate 20 by the adhesive agent 70, the infrared detector 10 joined to the electrode patterns 20*b*, 20*c* by the Ag paste 60, the other electronic device joined thereto, and the like. Preferably, the glass epoxy base 20*a* is made of a material having a great thickness so that deformation such as warp due to the stress is less likely to occur, and in general, the glass epoxy base 20*a* having a thickness of 0.8 mm to 1.0 mm is used, for example.

FIG. 1 and FIG. 2 show the example in which only one infrared detector 10 is provided to the glass epoxy substrate 20. However, a plurality of infrared detectors 10 may be provided to one glass epoxy substrate 20. Further, although the number of the glass epoxy substrates 20 is one here, the number of the glass epoxy substrates 20 is not limited to one. For example, the following structure may be employed: in one glass epoxy substrate 20, a plurality of identical electrode patterns 20*b*, 20*c* are provided, the infrared detectors 10 and other electronic devices are arranged and joined one by one onto the individual electrode patterns 20*b*, 20*c*, the area of each infrared detector 10 is covered by the lens holding member 80 and thus is sealed, and then cutting and division are performed for the individual electrode patterns 20*b*, 20*c*.

In general, the electrode pattern 20*b* and the electrode pattern 20*c* are made of the same material. The infrared detector 10 is joined to one electrode pattern 20*b* by the Ag paste 60, and the electrode pattern 20*b* has a connection portion formed thereon using an Au wire or the like, thereby electrically connecting another electronic device and the infrared detector 10. Such an electrode pattern 20*b* is a wiring member for electrically connecting the infrared detector 10 and an external circuit, and therefore is preferably made of metal having a small electric resistance. Therefore, in general, the electrode patterns 20*b*, 20*c* are made of a Cu foil having a thickness of about 10 to 40 μm, for example.

The infrared detector 10 and the electrode pattern 20*b* formed on the glass epoxy substrate 20 are joined by the Ag paste 60 which is a joining material. When the infrared detector 10 is to be joined by the Ag paste 60, other electronic components have been already joined onto the glass epoxy substrate 20 by solder. Therefore, preferably, the curing temperature of the Ag paste 60 is lower than the melting point of the solder so that the surrounding solder will not be melted again when the infrared detector 10 is joined. In addition, preferably, the joining material having high thermal conductivity is used in order to prevent temperature increase of the infrared detector 10. Therefore, the joining material is not limited to the Ag paste and may be another conductive adhesive agent or a sintered joining material of Ag nanoparticle paste or the like, but it is preferable to use the Ag paste in terms of adhesion temperature, thermal conductivity, cost, and the like.

The adhesive agent 70 adheres the bottom surface 84 of the lens holding member 80 and the surface of the glass epoxy substrate 20 on the side where the infrared detector 10 is joined. When the lens holding member 80 is to be adhered by the adhesive agent 70, the infrared detector 10 has been adhered to the surface of the glass epoxy substrate 20 by the Ag paste 60, the other electronic components have been joined by solder, and Au wires and the like which are members for electrically connecting these have been arranged. Therefore, preferably, the curing temperature of the adhesive agent 70 is lower than the heat-resistant temperatures of the infrared detector 10, the other electronic components, and the lens holding member 80, and the melting point of the solder, so that the other members mounted on the glass epoxy substrate 20 will not be broken or the solder will not be melted again when the adhesive agent 70 is cured.

Since the above members are stored on the inner side of the lens holding member 80, it is preferable to prevent the adhesive agent 70 from wetting and spreading to the inner side of the lens holding member 80, so that a wire will not be detached or adjacent wires will not come into contact with each other. After the adhesive agent 70 is pasted on the glass epoxy substrate 20 and the lens holding member 80 is mounted on the pasted adhesive agent 70, if a worker performs a conveyance process before the adhesive agent 70 is cured, the lens holding member 80 might be peeled or moved due to vibration during conveyance, impact upon dropping, or the like. This might cause such a problem that infrared rays cannot be focused on the infrared detector 10 so that imaging cannot be performed, an image is partially lost, or an image becomes out of focus, for example. Therefore, preferably, the adhesive agent 70 can be cured in the same apparatus as used for mounting the lens holding member 80 on the pasted adhesive agent 70 and the adhesive agent 70 can be cured without damaging the surrounding members. Therefore, preferably, the adhesive agent 70 is a UV curable adhesive agent which is cured by being irradiated with UV rays or a UV-thermosetting adhesive agent which is cured with combination of UV irradiation and heating at a temperature lower than the melting point of the solder or the heat-resistant temperatures of the surrounding members.

Similarly, when the lens holding member 80 is to be mounted on the pasted adhesive agent 70, if the load for mounting the lens holding member 80 is small or the amount of the pasted adhesive agent 70 is excessively large, the lens holding member 80 might be inclined with respect to the glass epoxy substrate 20, so that infrared rays cannot be focused on the infrared detector 10. Conversely, if the load for mounting the lens holding member 80 is excessively great, the adhesive agent 70 might be deformed so as to wet and spread to the inner/outer side of the bottom surface 84 of the lens holding member 80 beyond the design value. The adhesive agent 70 wetting and spreading to the outer side of the lens holding member 80 might hamper attachment of the optical sensor module 101 to a product. In addition, the adhesive agent 70 wetting and spreading to the inner side of the lens holding member 80 might come into contact with the wiring member such as a wire so that the joining part between the wire and the glass epoxy substrate 20 is detached or the wire collapses to come into contact with an adjacent wire. On the other hand, if the amount of the pasted adhesive agent 70 is excessively small, the adhesive agent 70 might not sufficiently wet and spread on the bottom surface 84 of the lens holding member 80, so that the adhesion strength is weakened and thus reliability of the optical sensor module 101 is reduced.

The lens holding member 80 is a box made of thermoplastic resin, thermosetting resin, metal, or the like and having an upper surface portion having a flat-plate shape, a side portion contiguous to the outer edge of the upper surface portion, and an opening surrounded by the side portion. The shape of the upper surface portion is a square shape in the present embodiment 1, but may be a rectangular shape, a circle shape, an elliptic shape, or the like. The lens 90 is integrally fixed in the upper surface portion of the lens holding member 80, and the entire periphery of the bottom surface 84 is adhered to the glass epoxy substrate 20 by the adhesive agent 70 at such a position that infrared rays having transmitted through the lens 90 are focused on the light receiving portion of the infrared detector 10. The inside of the lens holding member 80 is evacuated to seal the infrared detector 10. In order to increase the adhesion area of the bottom surface 84 which is the adhesion surface of the lens holding member 80 and thus enhance the adhesion strength, an edge 81 is formed such that the sides of the square protrude outward as shown in FIG. 1 and FIG. 2. In addition, at the parts corresponding to the four corners of the square, projections 82 having a truncated cone shape with a bottom diameter equal to or smaller than the width of the bottom surface 84 of the lens holding member 80 are formed from the bottom surface 84 of the lens holding member 80 toward the glass epoxy substrate 20 side opposed to the lens holding member 80. The bottom surface 84 of the lens holding member 80 and the glass epoxy substrate 20 are adhered to each other such that the distal ends of the projections 82 are in contact with the glass epoxy substrate 20.

In a case of using thermoplastic resin for the lens holding member 80, polycarbonate (PC) is generally used. Other than PC, PA66 (NYLON66), polybutylene terephthalate (PBT), poly phenylene sulfide (PPS), or the like may be used. These resins are high in heat-resisting property and therefore are preferable because, even in a case where heating is needed for curing the adhesive agent 70, the heating temperature can be set to be high. Since the bottom surface 84 of the lens holding member 80 and the glass epoxy substrate 20 are adhered with the adhesive agent 70 interposed therebetween, the height of the projections 82 becomes the thickness of the adhesive agent. It is desirable to set the height of the projections 82 to be great to such a degree that can absorb the warp amount of the glass epoxy substrate 20 or stress caused by linear expansion coefficient difference between the lens holding member 80 and the glass epoxy substrate 20, and to be smaller than the thickness of the pasted adhesive agent 70. Specifically, it is preferable that the height of the projections 82 is about 10 to 200 µm.

In the present embodiment 1, the lens 90 is a silicon lens having convex spherical surfaces on both sides, and the outer periphery thereof is covered by the lens holding member 80 so as to be integrated therewith, and thus is fixed to the upper surface portion of the lens holding member 80. Therefore, when the lens holding member 80 is moved, the lens 90 is also moved together with the lens holding member 80. Accordingly, the relative position with respect to the infrared detector 10 is changed due to movement of the lens holding member 80. In addition, the lens 90 allows transmission of infrared rays but does not allow transmission of visible light, and therefore it is impossible to observe the inside of the lens holding member 80 through the lens 90.

In order to perform correct imaging by the infrared detector 10, assembling is made such that the position of the lens 90 is set with the focal point thereof overlapping the light receiving portion of the infrared detector 10. However, in particular, in the case where the lens 90 and the lens holding member 80 are formed integrally, if the lens holding member 80 is inclined with respect to the infrared detector 10, there is a possibility that the focal point of the lens 90 deviates from the light receiving portion of the infrared detector 10 and thus the infrared detector 10 becomes unable to receive light correctly. As a result, there is such a risk that the infrared detector 10 becomes unable to perform imaging, or even if the displacement is slight, an image is partially lost or becomes out of focus, for example.

When the lens holding member 80 is mounted, wiring members and the like for operating the infrared detector 10 are present on the electrode pattern 20b of the glass epoxy substrate 20 in the area stored in the lens holding member 80. Therefore, when the lens holding member 80 is mounted on the adhesive agent 70, if the amount of the pasted adhesive agent 70 is large or the load of a nozzle for mounting the lens holding member 80 is great, the adhesive agent 70 compressed by the lens holding member 80 and thus wetting and spreading to the inner side of the lens holding member 80 comes into contact with the wiring member on the inner side of the lens holding member 80. The wiring member in contact with the adhesive agent 70 is deformed to come into contact with the wiring member therearound or lead to breakage of a wire, thus causing a risk of such failure that the optical sensor module 101 does not operate, for example.

In a case where the lens holding member and the lens in the optical sensor module are separate members, if the displacement is slight, it is possible to adjust the position of the lens again so that the focal point thereof overlaps the light receiving portion of the infrared detector after the adhesive agent adhering the lens holding member to the substrate is cured. However, in the optical sensor module according to the present disclosure, for the purpose of reducing the number of components to reduce the cost, the lens holding member 80 and the lens 90 are formed integrally, and therefore it is impossible to adjust the position of the lens 90 again after the lens holding member 80 is mounted on the adhesive agent 70. Thus, even before the adhesive agent 70 is cured, a risk of causing failure due to deviation of the relative positions of the light receiving portion of the infrared detector 10 and the focal point of the lens 90 is higher as compared to the optical sensor module in which the lens holding member 80 and the lens 90 are separate members.

In order to prevent this, it is important to mount the lens holding member 80 such that the bottom surface 84 of the lens holding member 80 is parallel to the glass epoxy substrate 20 irrespective of the amount of the pasted adhesive agent 70 or the mounting load of the lens holding member 80. Therefore, in the optical sensor module according to the present embodiment 1, the projections 82 having the same height are provided on the bottom surface 84 at four corners of the lens holding member 80 to which the lens 90 is fixed, as shown in FIG. 1 and FIG. 2.

Figure 3:
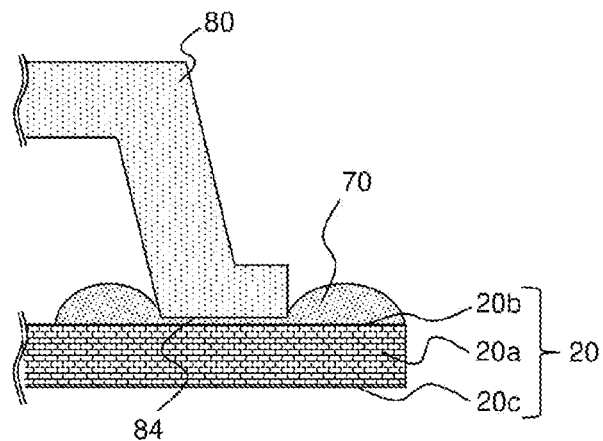
FIG. 3 is an enlarged sectional view showing the structure of a specific part of an optical sensor module in a comparative example.
Figure 4:
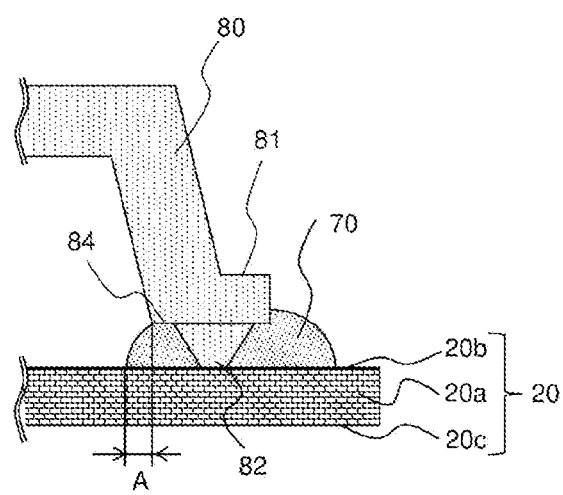
FIG. 4 is an enlarged sectional view showing the structure of a specific part of the optical sensor module according to embodiment 1.

Thus, a space corresponding to the height of the projections 82 is formed between the glass epoxy substrate 20 and the bottom surface 84 of the lens holding member 80. Therefore, as compared to a case where the bottom surface of the lens holding member is a flat surface without the projections 82, it is possible to reduce the volume of the adhesive agent 70 that protrudes from under the bottom surface 84 of the lens holding member 80 by being compressed by the lens holding member 80 and wets and spreads to the inner side of the lens holding member 80. In the optical sensor module having no projections as a comparative example shown in FIG. 3, the adhesive agent 70 wetting and spreading to the inner side of the lens holding member 80 has a shape close to a semicircle. On the other hand, in the optical sensor module 101 according to the present embodiment 1, as shown in FIG. 4, the adhesive agent 70 wetting and spreading to the inner side has a shape close to a sector shape, so that a distance A over which the adhesive agent 70 wets and spreads on the surface of the glass epoxy substrate 20 can be reduced. Therefore, the adhesive agent 70 compressed by the lens holding member 80 and thus wetting and spreading to the inner side of the lens holding member 80 can be inhibited from coming into contact with the wiring member on the inner side of the lens holding member 80.

Figure 5:
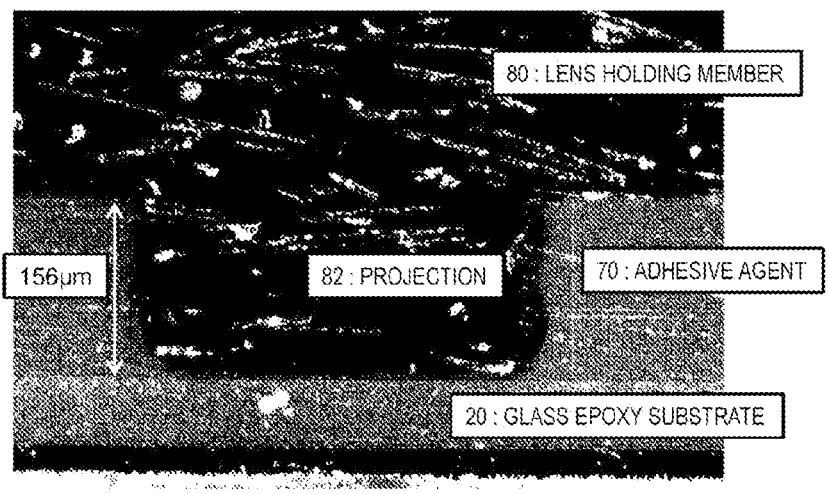
FIG. 5 shows a photograph of the cross-section of the specific part of the optical sensor module according to embodiment 1.

In addition, since the projections 82 formed at four locations are set to the same height and the distal ends of the projections 82 are in contact with the glass epoxy substrate 20, the lens holding member 80 can be prevented from being inclined with respect to the glass epoxy substrate 20. Thus, the lens 90 integrally formed and fixed to the lens holding member 80 can be prevented from being inclined with respect to the infrared detector 10 joined onto the glass epoxy substrate 20. Here, the shape of each projection 82 is formed to be a truncated cone with the bottom surface diameter smaller than the width of the bottom surface 84 of the lens holding member 80, whereby, when the lens holding member 80 is mounted on the adhesive agent 70, even with an extremely small mounting load, the distal ends of the projections 82 come into contact with the adhesive agent 70 and then can push out the adhesive agent 70 to come into contact with the surface of the glass epoxy substrate 20. FIG. 5 shows a cross-section when the lens holding member 80 with the projections 82 provided on the bottom surface 84 is adhered to the glass epoxy substrate 20 by the adhesive agent 70.

Further, since glass epoxy which is a main material of the glass epoxy substrate 20 and thermoplastic resin which is a main material of the lens holding member 80 are different in linear expansion coefficient, stress occurs at the adhesion part due to driving of the infrared detector or change in the ambient temperature. This stress repeatedly occurs as the usage time of the optical sensor module increases, and thus there is a possibility that the adhesion part is broken or peeled due to fatigue. Also by this, the position of the lens holding member 80 might be changed, so that the relative positions of the light receiving portion of the infrared detector 10 and the focal point of the lens 90 are changed, thus causing such a risk that the infrared detector 10 becomes unable to perform imaging, or an image is partially lost or becomes out of focus, for example.

In the optical sensor module according to the present embodiment 1, the adhesive agent 70 wets and spreads in the space corresponding to the height of the projections 82 and formed between the glass epoxy substrate 20 and the bottom surface 84 of the lens holding member 80, whereby the adhesive agent 70 becomes thicker as compared to the optical sensor module without projections. Thus, shear strain occurring in the adhesive agent 70 due to linear expansion coefficient difference between the glass epoxy substrate 20 and the lens holding member 80 can be reduced as compared to the optical sensor module without projections, whereby the life of the adhesion part by the adhesive agent 70 can be prolonged.

Figure 6:
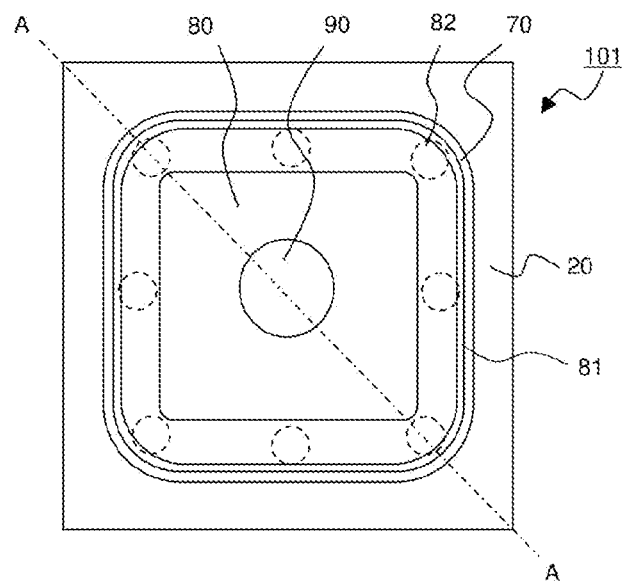
FIG. 6 is a plan view showing another structure of the optical sensor module according to embodiment 1.
Figure 7:
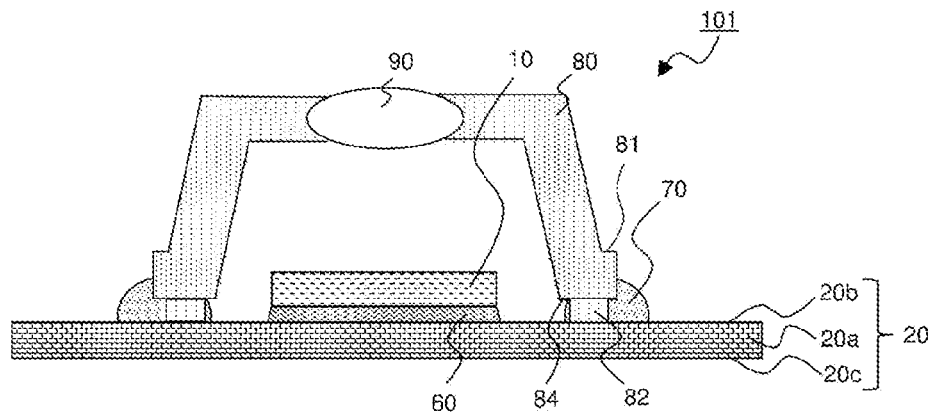
FIG. 7 is a sectional view along line A-A in FIG. 6, showing the other structure of the optical sensor module according to embodiment 1.
Figure 8:
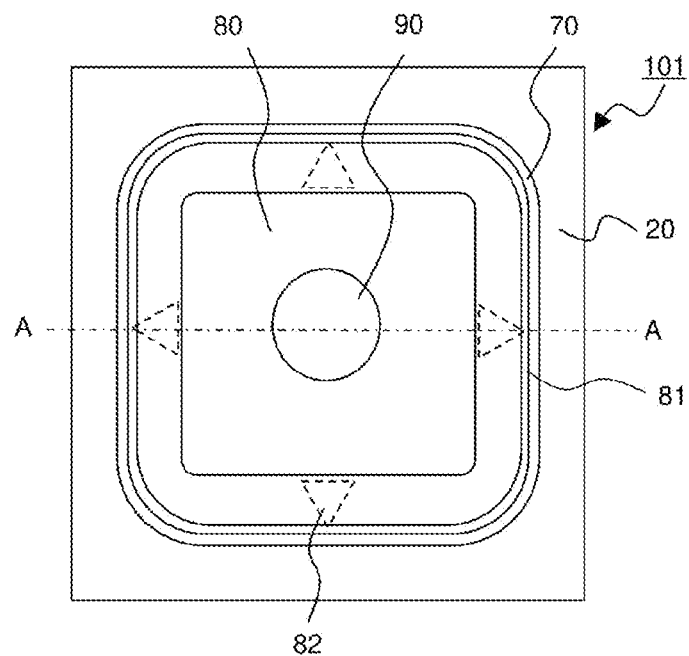
FIG. 8 is a plan view showing still another structure of the optical sensor module according to embodiment 1.
Figure 9:
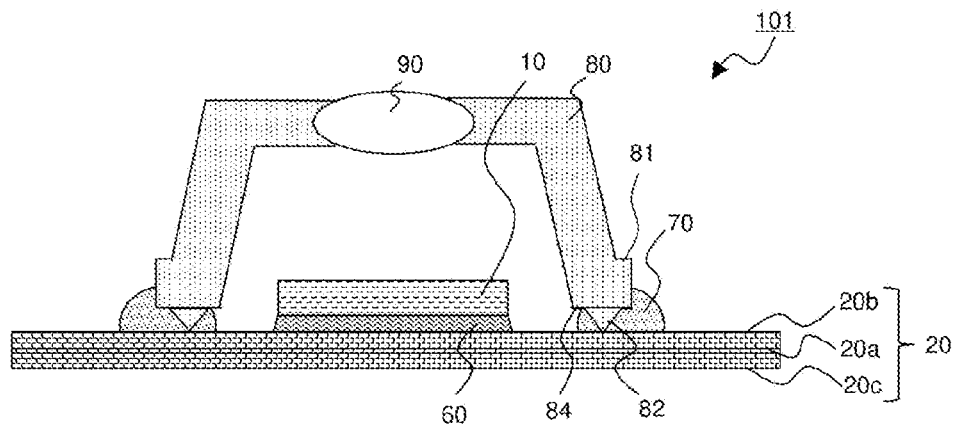
FIG. 9 is a sectional view along line A-A in FIG. 8, showing the still other structure of the optical sensor module according to embodiment 1.

Any number of the projections 82 may be formed in any shape at any locations on the bottom surface 84 which is the adhesion surface of the lens holding member 80 to be adhered with the adhesive agent 70. For example, as shown in a plan view in FIG. 6 and a sectional view in FIG. 7 along line A-A in FIG. 6, projections having a columnar shape may be provided at a total of eight locations at the corners and the centers of the sides of the lens holding member 80. Alternatively, projections having a prism shape may be provided. Alternatively, as shown in a plan view in FIG. 8 and a sectional view in FIG. 9 along line A-A in FIG. 8, projections having a triangular pyramid shape may be provided at a total of four locations at the centers of the sides of the lens holding member 80. Alternatively, projections having a quadrangular pyramid shape may be provided.

In the case where the projections 82 are formed at such locations that the distal ends thereof come into contact with the adhesive agent 70 when the lens holding member 80 is mounted on the adhesive agent 70, it is preferable that each projection 82 has such a shape that the area of the distal end thereof is sufficiently smaller as compared to the bottom surface 84 of the lens holding member 80 so that, even with an extremely small mounting load, the projection 82 can push out the adhesive agent 70 to come into contact with the surface of the glass epoxy substrate 20. For example, it is preferable that the projections 82 has a pillar shape such as a columnar shape or a prism shape having an area not larger than a square with the length of one side equal to the width of the bottom surface 84, a conical/pyramidal shape such as a cone or a pyramid, or a frustum shape such as a truncated cone or a truncated pyramid. A conical/pyramidal shape or a frustum shape of which the sectional area reduces from the bottom surface 84 toward the distal end, i.e., the sectional area is smaller at the distal end than at the bottom, is such a shape that, in a case where the lens holding member 80 is formed by injection molding, extraction from a mold can be easily performed, and the adhesive agent 70 can be easily pushed out. Therefore, a conical/pyramidal shape or a frustum shape is particularly preferable. Alternatively, projections having a curved surface, e.g., a hemisphere shape, may be used.

In addition, it is necessary to provide three or more projections 82 having the same height so that the lens 90 formed integrally with the lens holding member 80 becomes parallel to the glass epoxy substrate 20 when the lens holding member 80 is mounted on the adhesive agent 70 pasted on the glass epoxy substrate 20.

Figure 10:
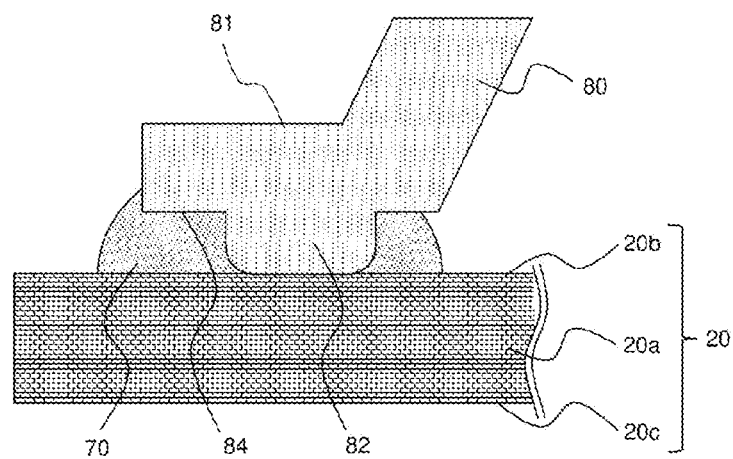
FIG. 10 is an enlarged sectional view showing further another structure of the specific part of the optical sensor module according to embodiment 1.

In addition, as shown in an enlarged sectional view in FIG. 10, if each projection 82 is formed such that a corner of the distal end thereof in contact with the adhesive agent 70 and the glass epoxy substrate 20 is rounded, stress caused by temperature change in the optical sensor module 101 does not concentrate on the corner of the distal end of the projection 82. Thus, the adhesive agent is prevented from peeling from the inner periphery of the lens holding member due to stress concentration by thermal stress, whereby the life of the optical sensor module 101 can be more prolonged. In addition, this configuration can prevent positional displacement of the lens holding member 80 in the height direction and therefore is more preferable.

In addition, if the surface roughness of the bottom surface 84 of the lens holding member 80 is made greater as compared to the other parts of the lens holding member 80, the adhesion strength between the lens holding member 80 and the adhesive agent 70 is increased. Thus, joining reliability can be improved and therefore this configuration is more preferable.

Further, if the surface roughness of the distal end of each projection 82 that is in contact with the glass epoxy substrate 20 is made greater as compared to the other surfaces of the lens holding member 80, the frictional force between the glass epoxy substrate 20 and the lens holding member 80 increases. Thus, positional displacement between the light receiving portion of the infrared detector 10 and the optical center of the lens 90 by positional displacement of the lens holding member 80 due to curing contraction of the adhesive agent 70 or the like can be suppressed and therefore this configuration is more preferable.

As described above, in the optical sensor module 101 according to embodiment 1, the projections 82 are provided on the bottom surface 84 which is the adhesion surface of the lens holding member 80 to be adhered by the adhesive agent 70, whereby a space corresponding to the height of the projections 82 is formed between the glass epoxy substrate 20 and the bottom surface 84 of the lens holding member 80.

Thus, the volume of the adhesive agent 70 wetting and spreading to the inner side of the lens holding member 80 can be reduced. In addition, even if the adhesive agent 70 wets and spreads to the inner side of the lens holding member 80, the wetting and spreading adhesive agent 70 has a shape close to a sector shape, so that the distance A over which the adhesive agent 70 wets and spreads on the surface of the glass epoxy substrate 20 can be reduced. Therefore, the adhesive agent 70 wetting and spreading to the inner side of the lens holding member 80 can be prevented from coming into contact with the wiring member on the inner side of the lens holding member 80. In addition, since the plurality of projections 82 are formed to have the same height and the distal ends of the projections 82 are in contact with the glass epoxy substrate 20, it is possible to prevent such a phenomenon that the lens 90 formed integrally with the lens holding member 80 is inclined with respect to the infrared detector 10 so that the infrared detector 10 becomes unable to perform imaging or an image is partially lost or becomes out of focus. Further, since the adhesive agent 70 is thicker as compared to the optical sensor module without projections, shear strain occurring in the adhesive agent 70 due to linear expansion coefficient difference between the glass epoxy substrate 20 and the lens holding member 80 can be reduced, whereby the life of the adhesion part by the adhesive agent 70 can be prolonged and thus the optical sensor module 101 having high quality can be obtained.

Embodiment 2

Figure 11:
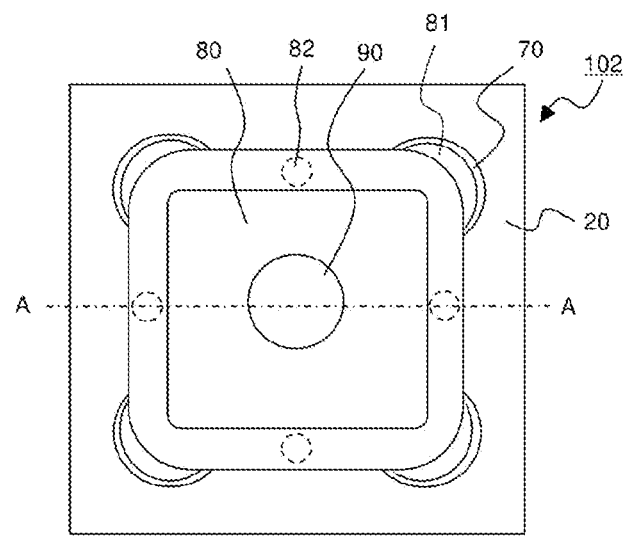
FIG. 11 is a plan view showing the structure of an optical sensor module according to embodiment 2.
Figure 12:
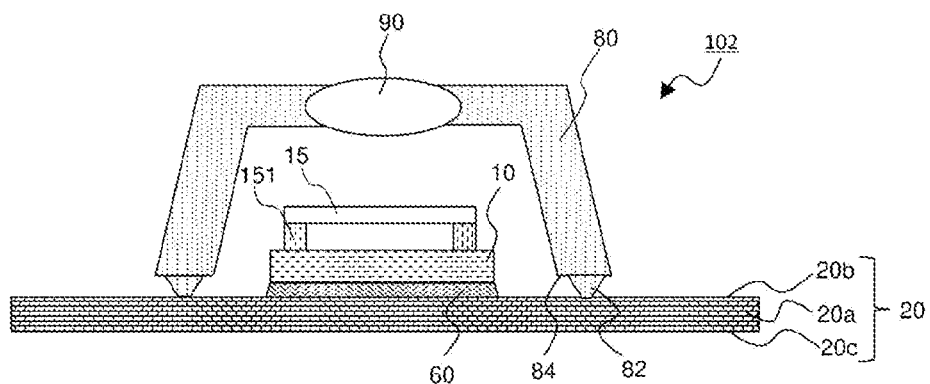
FIG. 12 is a sectional view along line A-A in FIG. 11, showing the structure of the optical sensor module according to embodiment 2.

FIG. 11 is a plan view showing the schematic structure of an optical sensor module 102 according to embodiment 2, and FIG. 12 is a sectional view along line A-A in FIG. 11. The optical sensor module 102 according to the present embodiment 2 basically has the same structure as the optical sensor module 101 according to embodiment 1, but has difference as described below. Here, the difference will be mainly described and description of the same constituent parts is omitted. FIG. 11 and FIG. 12 are schematic views showing only basic constituent parts in the optical sensor module 102, and description of the other constituent parts is omitted.

In embodiment 1, the infrared detector 10 is sealed by making the inside of the lens holding member 80 into a vacuum state after the entire periphery of the bottom surface 84 of the lens holding member 80 is adhered by the adhesive agent 70. On the other hand, in the present embodiment 2, as shown in FIG. 11 and FIG. 12, a light transmitting plate 15 which is a light transmitting member is joined onto the infrared detector 10 via a frame 151 so as to be spaced from the surface of the infrared detector 10. Embodiment 2 is different from embodiment 1 in that the infrared detector 10 is sealed by making the internal space formed between the infrared detector 10 and the light transmitting plate 15 into a vacuum state, and the inside of the lens holding member 80 is not sealed into a vacuum state.

The light transmitting plate 15 made of silicon which is a material that allows transmission of infrared rays as with the lens 90 is coated with metal at a part to be joined to the frame 151, and is joined by solder to the frame 151 joined to the surface of the infrared detector 10. Thus, the light transmitting plate 15 is fixed to the light incidence side of the light receiving portion of the infrared detector 10 so as to be integrated with the infrared detector 10, thereby covering the light receiving portion of the infrared detector 10. The inside enclosed by the infrared detector 10, the frame 151, and the light transmitting plate 15 is sealed into a vacuum state. In addition, the light transmitting plate 15 allows transmission of infrared rays but does not allow transmission of visible light, and therefore it is impossible to observe the light receiving portion of the infrared detector 10 through the light transmitting plate 15.

In the present embodiment 2, the positions where the bottom surface 84 of the lens holding member 80 and the glass epoxy substrate 20 are adhered by the adhesive agent 70 are only four corners of the lens holding member 80, and the projections 82 having the same height are provided on the bottom surface 84 of the lens holding member 80 at a total of four locations at the centers of the sides of the lens holding member 80.

Since the infrared detector 10 is sealed into a vacuum state by the light transmitting plate 15, it is not necessary to seal the inside of the lens holding member 80 into a vacuum state, and therefore it is not necessary to adhere the entire periphery of the bottom surface 84 of the lens holding member 80 by the adhesive agent 70. The adhesive agent 70 has only to be pasted in such an amount that the adhesion part will not be broken or peeled due to fatigue, and for example, as shown in FIG. 11 and FIG. 12, the adhesive agent 70 may be pasted at only four corners of the lens holding member 80. In this case, brims 81 are provided at only the four corners of the lens holding member 80 to be adhered by the adhesive agent 70, so that the area of the bottom surface 84 can be reduced by an amount of decrease in the adhesion area of the lens holding member 80, and thus the entire optical sensor module 102 can be downsized. In addition, since the adhesion area of the adhesive agent 70 is reduced as compared to the case of adhering the entire periphery by the adhesive agent 70, shear strain occurring in the adhesive agent 70 due to linear expansion coefficient difference between the glass epoxy substrate 20 and the lens holding member 80 is reduced. Thus, the effect of the optical sensor module according to the present disclosure that the life of the adhesion part by the adhesive agent 70 can be prolonged is further enhanced.

Further, as shown in FIG. 11 and FIG. 12, the projections 82 can be provided at, for example, a total of four locations at the centers of the sides of the lens holding member 80, and in this way, it becomes easy to provide the projections 82 at such locations where the adhesive agent 70 is not pasted. Thus, the shapes of the projections 82 can be more freely selected. Moreover, since the adhesive agent does not enter between the distal end of each projection 82 and the glass epoxy substrate 20, the distal end of the projection 82 can be assuredly brought into contact with the surface of the glass epoxy substrate 20. Thus, the effect of preventing such a phenomenon that the lens 90 formed integrally with the lens holding member 80 is inclined with respect to the infrared detector 10 joined onto the glass epoxy substrate 20 so that imaging cannot be performed or an image is partially lost or becomes out of focus, is obtained more assuredly.

In the above description, adhesion is made at only four corners instead of the entire periphery of the bottom surface 84 of the lens holding member 80. However, in the structure in which vacuum sealing is made by the light transmitting plate 15 and the frame 151, the entire periphery of the bottom surface 84 of the lens holding member 80 may be adhered by the adhesive agent 70 in the same manner as described in embodiment 1. Also in this case, it is not necessary to seal the inside of the lens holding member 80 into a vacuum state, and therefore the adhesion need not be made in an airtight state.

Embodiment 3

Figure 13:
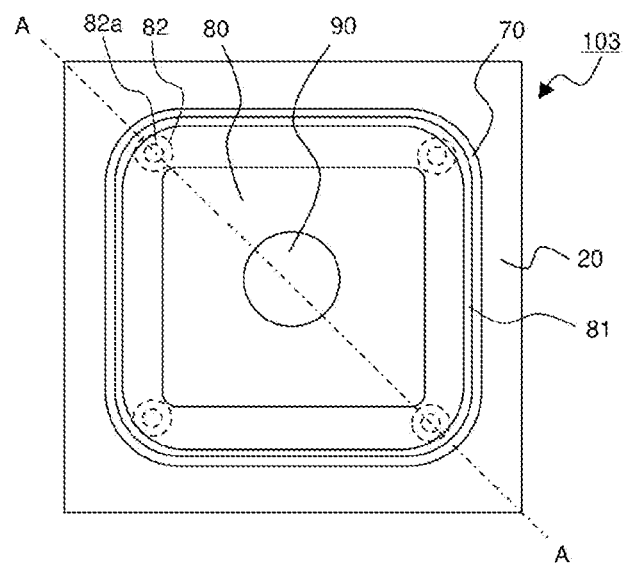
FIG. 13 is a plan view showing the structure of an optical sensor module according to embodiment 3.
Figure 14:
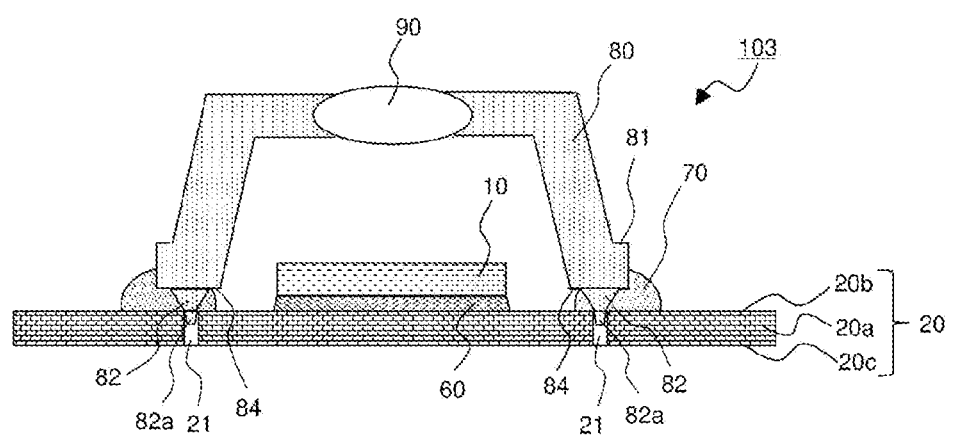
FIG. 14 is a sectional view along line A-A in FIG. 13, showing the structure of the optical sensor module according to embodiment 3.

FIG. 13 is a plan view showing the schematic structure of an optical sensor module 103 according to embodiment 3, and FIG. 14 is a sectional view along line A-A in FIG. 13. Also the optical sensor module 103 according to the present embodiment 3 basically has the same structure as the optical sensor module 101 according to embodiment 1, but has difference as described below. Here, the difference will be mainly described and description of the same constituent parts is omitted. FIG. 13 and FIG. 14 are schematic views showing only basic constituent parts in the optical sensor module 103, and description of the other constituent parts is omitted.

In the present embodiment 3, as shown in FIG. 13 and FIG. 14, at the distal end of each projection 82 provided on the bottom surface 84 of the lens holding member 80, a positioning projection 82a extending in a truncated cone shape from the distal end of the projection 82 is formed integrally with the projection 82. A positioning hole 21 is formed in the glass epoxy substrate 20 at a position corresponding to each positioning projection 82a, and the bottom surface 84 of the lens holding member 80 and the glass epoxy substrate 20 are adhered in a state in which the positioning projections 82a are inserted into the positioning holes 21.

When the lens holding member 80 is to be mounted on the adhesive agent 70 pasted on the glass epoxy substrate 20, the positioning projections 82a are inserted into the positioning holes 21 and then the distal ends of the projections 82 come into contact with the glass epoxy substrate 20, whereby the glass epoxy substrate 20 and the lens holding member 80 are adhered by the adhesive agent 70. Thus, for example, when the lens holding member 80 is mounted on the adhesive agent 70 pasted on the glass epoxy substrate 20, even if the position of the lens holding member 80 attempts to slightly move or rotate due to deformation of the adhesive agent 70, the lens holding member 80 can be adhered without being displaced, because the positioning projections 82a are inserted into the positioning holes 21.

In addition, in a case where the diameter of the bottom surface of the positioning projection 82a and the diameter of the positioning hole 21 are made equal to each other, even if contraction of the adhesive agent 70 at the time of adhering the lens holding member 80, deformation of the adhesive agent 70 due to driving of the optical sensor module 103 or change in the ambient temperature, or the like occurs, the positioning projection 82a inserted into the positioning hole 21 is in contact with the entrance of the positioning hole 21 at the bottom surface part and therefore the relative positions of the positioning projection 82a and the positioning hole 21 are not changed. Thus, it is possible to prevent such failure that, due to change in the position of the lens holding member 80, the relative positions of the light receiving portion of the infrared detector 10 and the focal point of the lens 90 are changed so that imaging cannot be performed or an image is partially lost or becomes out of focus, for example.

As described above, the positioning projections 82a are formed on the distal ends of the projections 82, the positioning holes 21 are formed in the glass epoxy substrate 20, and the positioning projections 82a are inserted into the positioning holes 21, whereby positioning of the lens holding member 80 on the glass epoxy substrate 20 can be made assuredly. Further, the position of the lens holding member 80 is not displaced even by deformation of the adhesive agent 70 or thermal stress occurring due to temperature change at the time of or after adhesion, and therefore positional displacement between the light receiving portion of the infrared detector 10 and the optical center of the lens 90 can be prevented.

In the present embodiment 3, the projections 82 are formed at four corners of the lens holding member 80, the positioning projection 82a is formed on each projection 82, and the positioning hole 21 is formed in the glass epoxy substrate at a position corresponding to the positioning projection 82a. Without limitation thereto, the projections 82 having the positioning projections 82a may be provided at a total of eight locations at the corners and the centers of the sides of the lens holding member 80, or may be provided at a total of four locations at the centers of the sides of the lens holding member 80. Alternatively, the positioning projections 82a may be provided on not all the projections 82 but on only some of the projections 82. However, in order to obtain the effect of positioning the lens holding member 80 on the glass epoxy substrate 20 and preventing positional displacement of the lens holding member 80 at the time of or after adhesion, it is necessary to provide the positioning projections 82a and the positioning holes 21 at mutually corresponding positions in at least two locations.

Further, as in the above embodiment 2, the structure may be made such that the light transmitting plate 15 which is the light transmitting member is joined by solder onto the infrared detector 10, the infrared detector 10 is sealed by making the internal space formed between the infrared detector 10 and the light transmitting plate 15 into a vacuum state, and the inside of the lens holding member 80 is not sealed into a vacuum state. Since the inside of the lens holding member 80 need not be sealed into a vacuum state, it is not necessary to paste the adhesive agent 70 over the entire periphery of the bottom surface 84 of the lens holding member 80, and therefore it becomes easy to provide the projections 82 at locations where the adhesive agent 70 is not pasted. Moreover, the adhesive agent 70 can be prevented from leaking out through the positioning hole 21 to the back surface of the glass epoxy substrate 20, and the effect of the present embodiment 3 that the lens holding member 80 is positioned on the glass epoxy substrate 20 and positional displacement of the lens holding member 80 at the time of or after adhesion can be prevented, is obtained more assuredly.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure. It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 10 infrared detector (photodetector)
15 light transmitting plate (light transmitting member)
20 glass epoxy substrate (substrate)
20a glass epoxy base
20b, 20c electrode pattern
21 positioning hole
60 Ag paste 70 adhesive agent
80 lens holding member
82 projection
82a positioning projection
84 bottom surface
90 lens
101, 102, 103 optical sensor module

The invention claimed is:

1. An optical sensor module comprising:
a substrate having an electrode pattern formed on a surface thereof;
a photodetector for detecting light, the photodetector being electrically connected to the electrode pattern and being fixed to the substrate; and
a lens holding member to which a lens is fixed, the lens holding member being adhered to the substrate by an adhesive agent at such a position as to surround the photodetector, wherein
the lens holding member comprises:
an upper surface portion;
a side portion contiguous to an outer edge of the upper surface portion;
an opening surrounded by the side portion; and
a protruding portion that protrudes from a bottom of the side portion in a direction away from the opening, wherein
a bottom surface of the side portion including the protruding portion is parallel to a surface of the substrate and has projections located in a distributed manner, each projection has a plane at a distal end, a surface roughness of the distal end of each projection is greater than a surface roughness of another surface of the lens holding member, and the distal end of each projection is in direct contact with the substrate,
the bottom surface and the projections form an integrated structure of a same material,
the bottom surface is adhered to the substrate by the adhesive agent,
a thickness of the adhesive agent between the bottom surface and the substrate is equal to a height of the projections,
the adhesive agent is substantially absent from an inner surface of the side portion and is in contact with an outer side surface of the protruding portion, and
the projections are spaced from all of the adhesive agent.

2. The optical sensor module according to claim 1, wherein a light incidence side of the photodetector is sealed into a vacuum state by a member including a light transmitting member.

3. The optical sensor module according to claim 1, wherein the projections comprise three or more projections.

4. The optical sensor module according to claim 1, wherein a sectional area of a cross section of each projection along a direction parallel to the bottom surface is smaller at the distal end than at the bottom surface of the projection.

5. The optical sensor module according to claim 4, wherein a shape of each projection is a truncated cone or a truncated pyramid.

6. The optical sensor module according to claim 1, wherein a shape of each projection is a pillar shape.

7. The optical sensor module according to claim 4, wherein a corner of each projection is rounded.

8. The optical sensor module according to claim 1, wherein each projection has a positioning projection projecting from the distal end, and the positioning projection is inserted into a positioning hole provided in the substrate.

9. The optical sensor module according to claim 5, wherein a corner of each projection is rounded.

10. The optical sensor module according to claim 6, wherein a corner of each projection is rounded.

11. The optical sensor module according to claim 1, wherein the adhesive agent positioned inward of the projections is convex toward the photodetector.

12. The optical sensor module according to claim 1, wherein the protruding portion is one of a plurality of protruding portions of the lens holding member, the protruding portions being only provided at corners of the lens holding member in plan view.

13. The optical sensor module according to claim 1, wherein a light incidence side of the photodetector is sealed into a vacuum state by a member including a light transmitting member, and an inside of the lens holding member positioned outward from the member including the light transmitting member and the photodetector is not sealed into a vacuum state.

14. An optical sensor module comprising:
a substrate having an electrode pattern formed on a surface thereof;
a photodetector for detecting light, the photodetector being electrically connected to the electrode pattern and being fixed to the substrate; and
a lens holding member to which a lens is fixed, the lens holding member being adhered to the substrate by an adhesive agent at such a position as to surround the photodetector, wherein
the lens holding member comprises:
an upper surface portion;
a side portion contiguous to an outer edge of the upper surface portion;
an opening surrounded by the side portion; and
a protruding portion that protrudes from a bottom of the side portion in a direction away from the opening, wherein
a bottom surface of the side portion including the protruding portion is parallel to a surface of the substrate and has projections located in a distributed manner, each projection has a plane at a distal end, a surface roughness of the distal end of each projection is greater than a surface roughness of another surface of the lens holding member, and the distal end of each projection is in direct contact with the substrate,
the bottom surface and the projections form an integrated structure of a same material,
the bottom surface is adhered to the substrate by the adhesive agent,
a thickness of the adhesive agent between the bottom surface and the substrate is equal to a height of the projections,
the adhesive agent is substantially absent from an inner surface of the side portion and is in contact with an outer side surface of the protruding portion,
a light incidence side of the photodetector is sealed into a vacuum state by a member including a light transmitting member, and
an inside of the lens holding member positioned outward from the member including the light transmitting member and the photodetector is not sealed into a vacuum state.

* * * * *